United States Patent [19]

Aine et al.

[11] Patent Number: 4,597,003

[45] Date of Patent: Jun. 24, 1986

[54] CHEMICAL ETCHING OF A SEMICONDUCTIVE WAFER BY UNDERCUTTING AN ETCH STOPPED LAYER

[75] Inventors: Harry E. Aine, 30600 Page Mill Rd.; Barry Block, 30610 Page Mill Rd., both of Palo Alto, Calif. 94022

[73] Assignees: Harry E. Aine; Barry Block, both of Los Altos, Calif.

[21] Appl. No.: 556,832

[22] Filed: Dec. 1, 1983

[51] Int. Cl.[4] ............... H01L 21/306; G01L 1/22
[52] U.S. Cl. ........................... 357/26; 156/657;
156/628; 156/648; 156/662; 338/4; 338/42;
29/610 SG; 29/580; 73/514
[58] Field of Search ............ 156/345, 628, 644, 647,
156/648, 649, 650, 651, 654, 657, 659.1, 662,
655; 148/1.5; 29/580, 584, 586, 594, 595, 610
SG; 338/2, 4, 42, 47; 73/510, 517 R, 514, 726,
754; 357/26, 55; 204/129.65, 129.1, 325

[56] References Cited

U.S. PATENT DOCUMENTS

| | | | |
|---|---|---|---|
| 3,616,348 | 10/1971 | Greig | 204/129.65 |
| 3,689,389 | 9/1972 | Waggener | 156/646 |
| 3,853,650 | 12/1974 | Hartlaub | 156/655 |
| 3,912,563 | 10/1975 | Tomioka et al. | 156/345 |
| 4,071,838 | 1/1978 | Block | 156/647 X |
| 4,144,516 | 3/1979 | Aine | 29/580 |
| 4,293,373 | 10/1981 | Greenwood | 156/647 |

Primary Examiner—Edward Kimlin
Assistant Examiner—Ramon R. Hoch
Attorney, Agent, or Firm—Harry E. Aine

[57] ABSTRACT

Three dimensional single crystalline structures, such as folded cantilever beams supported from a frame and supporting a central structure free to move relative to the frame, are fabricated by anisotropically etching through openings in etch stop layers on opposite sides of the substrate wafer. The openings are patterned and aligned so that the etch stop layers are undercut to define etch stop portions interconnected by unetched substrate material.

10 Claims, 6 Drawing Figures

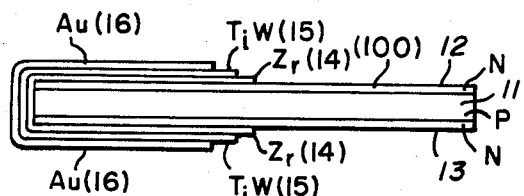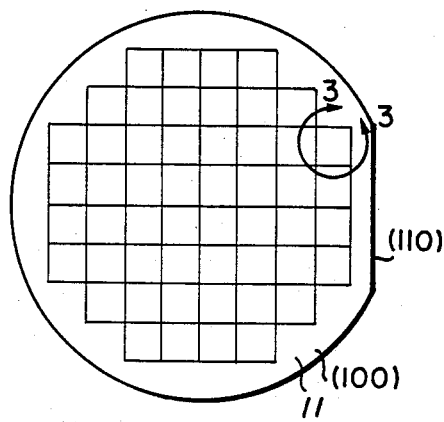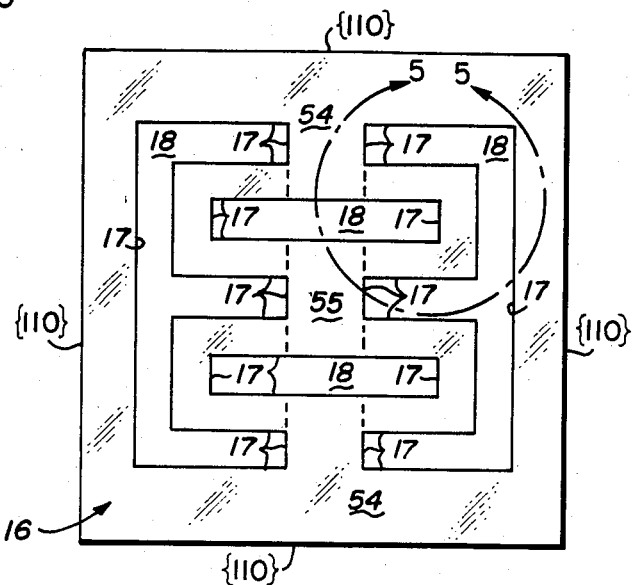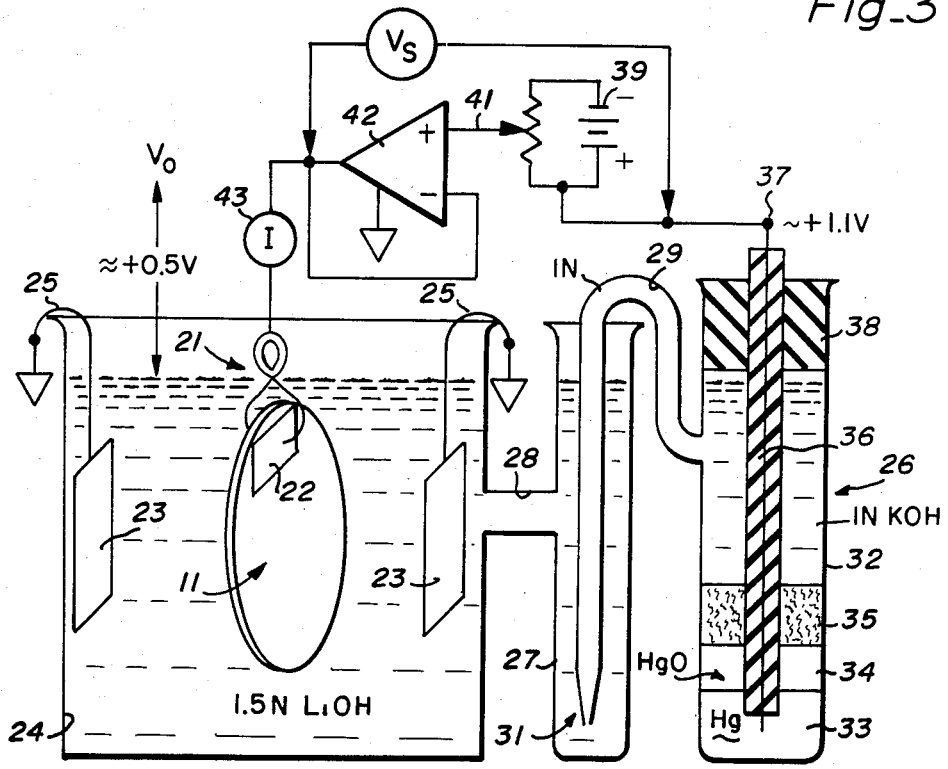

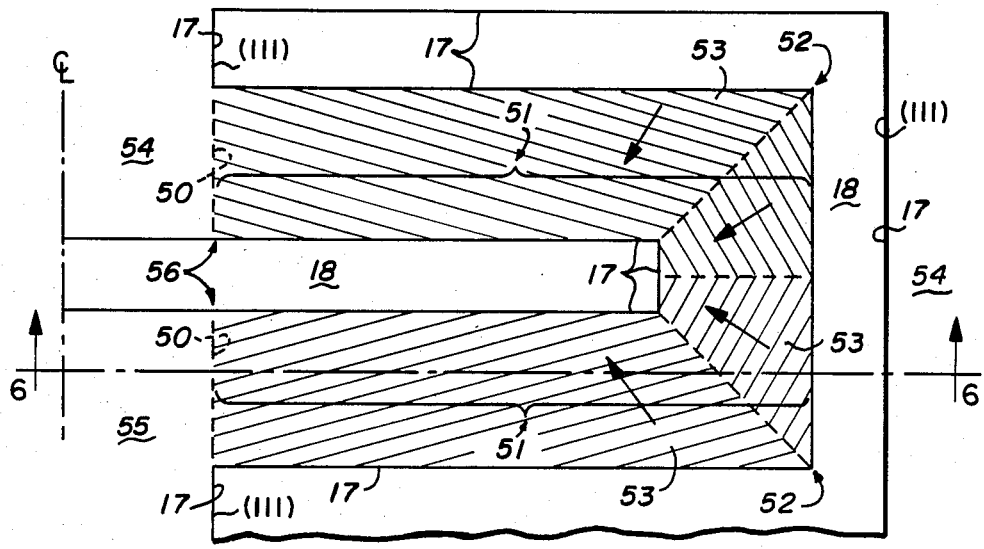
Fig_5
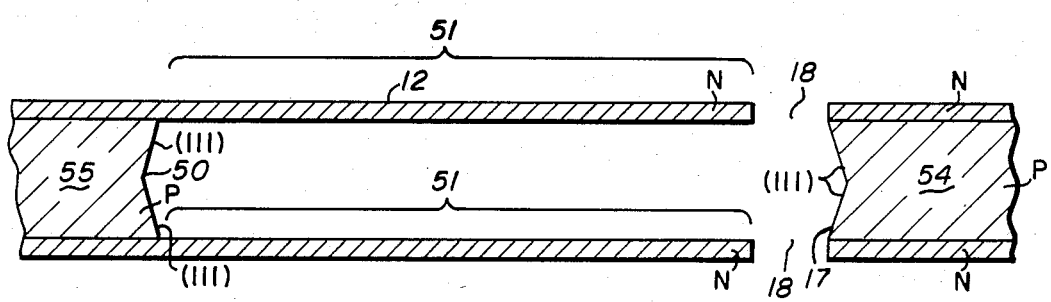
Fig_6

CHEMICAL ETCHING OF A SEMICONDUCTIVE WAFER BY UNDERCUTTING AN ETCH STOPPED LAYER

DESCRIPTION OF THE PRIOR ART

Heretofore, it has been proposed to make symmetrical accelerometer flex structures by chemically etching each of a pair of silicon wafers from one of the major faces to define in each wafer a membrane with an integral centrally located silicon mass. The membrane in each wafer was then etched through in a predetermined slot pattern to define folded cantilever beams in the slotted membrane portion for supporting the mass from a surrounding frame structure. The pair of etched wafers were then bonded together in back-to-back relation with the masses in registration to form symmetrical accelerometer flex structures. Devices of this type are disclosed in U.S. Pat. No. 4,144,516 issued Mar. 13, 1979.

While the aforementioned techniques may be employed for fabrication of symmetrical accelerometer flex structures, there are certain problems associated therewith that it would be desirable to eliminate. One of the problems is that the composite symmetrical flex structure is fabricated by bonding together two wafers. This introduces substantial handling and processing of the relatively fragile etched wafers tending to reduce the yield of acceptable devices. In addition, the bonding material typically has a temperature coefficient substantially different than that of the silicon flex structure such that undesired temperature coefficients are introduced into the composite structure. Moreover, in the case of a capacitive sensor for sensing deflection of the flex, with capacitive gap spacings on the order of microns, variations in the thickness of the bonding layer result in variations in the overall thickness of the flex structure and thus produces unwanted variations in the capacitance of the capacitor gap of the capacitive sensor.

It is also known from the prior art to form a single cantiliver beam by chemically undercutting an etch stopped layer which is to form the cantilever. In some cases, silicon dioxide cantilever beams have been loaded at their ends with a gold mass for increased sensitivity. Devices of this type are disclosed in an article entitled "Silicon as a Mechanical Material", appearing in the proceedings of the IEEE, Vol. 70, No. 5, of May 1982 at pgs. 446–450.

Some of the problems associated with accelerometers of the latter type are that the single cantilever beams do not exhibit a linear deflection in response to acceleration and, moreover, the mass loading to increase their sensitivity is of a dissimilar metal, typically gold, thereby introducing undesired temperature coefficients and resulting in an unsymmetrical structure which is subject to undesired cross-axis coupling coefficients.

It would be highly desirable if symmetrical folded cantilever accelerometer flex structures of the type disclosed in the aforecited U.S. Pat. No. 4,144,516 could be fabricated by etching a single semiconductive wafer.

SUMMARY OF THE PRESENT INVENTION

The present invention relates in general to chemical etching of semiconductive wafers by undercutting etch stopped layers.

In one feature of the present invention, etch stopped layers on opposite major faces of a semiconductive wafer are chemically undercut to define structure in both of said etch stopped layers interconnected by substrate semiconductive material, whereby three-dimensional structures are fabricated.

In another feature of the present invention, the semiconductive wafer substrate material is chemically etched by etchant introduced through openings in an etch stopped layer, said openings being patterned so that the etch stopped layer is undercut in such a manner as to define a cantilever beam supported at one end by a frame structure with an integral mass formed by the etch at the other end, such mass being free to move relative to the frame structure by bending of the cantilever beam.

In another feature of the present invention, the undercut etch stopped layer and the semiconductive substrate material are both of single crystalline semiconductive material, whereby undesired temperature coefficients associated with dissimilar materials are substantially reduced.

Other features and advantages of the present invention will become apparent upon a perusal of the following specification taken in connection with the accompanying drawings wherein:

BRIEF DESCRIPTION OF THE DRAWINGS

FIG. 1 is a transverse sectional view, partly cutaway, of a semiconductive wafer metallized for masking of the wafer in accordance with provisions of the present invention, FIG. 2 is a plan view of a wafer of FIG. 1 photomasked for etching, FIG. 3 is a detail plan view of that portion of the photomasked and etched wafer delineated by line 3—3 of FIG. 2, FIG. 4 is a schematic line diagram, partly in block diagram form, of an electrochemical etch apparatus useful for etching wafers in accordance with the provisions of the present invention, FIG. 5 is an enlarged plan view of a portion of the structure of FIG. 3 delineated by line 5—5, and FIG. 6 is a cross-sectional view of the structure of FIG. 5 taken along line 6—6 in the direction of the arrows.

DESCRIPTION OF THE PREFERRED EMBODIMENT

Referring now to FIGS. 1 and 2, there is shown a semiconductive wafer 11 of diamond cubic material, such as Si, Ge or gallium arsenide. In a typical example, wafer 11 has a thickness of approximately 15 mils, a diameter of approximately three inches and is made of single crystalline silicon doped with P-type dopant to a conductivity of between 1–10 $\Omega$cm. The wafer 11 is cut from the single crystal in such a manner as to provide the (100) major faces on opposite sides of the wafer. The wafer typically has a flat corresponding to the (110) face. The wafer 11 is polished on both major faces to a flatness on the order of a few microns. The bow of the wafer preferably is as low as possible and preferably less than 10 microns. Opposite or N-type conductivity epitaxial layers 12 and 13 are grown on opposite major faces of the wafer 11 with a resistivity of 1–10 $\Omega$cm. In a typical example, epitaxial layers 12 and 13 are grown to a thickness of between three and fifteen microns. The thickness of the epitaxial layers will depend upon the nature of the structure which it is desired to fabricate. In the case of an accelerometer, the aforementioned three to fifteen micron thickness is suitable.

The wafer is metallized for providing an etch resistant electrically conductive layer that will be employed as a part of the etch mask and as an electrode for an electro-etch stop etch process. In a typical example, the metallization layers comprise a base layer 14 of zirconium, as of 2,000 Å thick, deposited by sputter deposition onto the epitaxial layers 12 and 13. Next, titanium-tungsten layer 15 is deposited to a thickness of, for example, 500 Å to provide an adhesion layer between the zirconium and a subsequent layer of gold. Next, a gold layer 16 is deposited, as by sputter deposition, to a thickness of 3,000 Å onto the titanium-tungsten layer 15. Wafers 11 are then electroplated with gold to a gold layer thickness of approximately three microns to provide a pinhole-free gold metallization layer over the entire wafer.

After the wafer 11 has been metallized, it is coated as by spin coating, with photoresist and exposed and developed on both sides to a slot mask pattern of the type as shown in FIG. 3. The mask patterns are aligned to each other on opposite sides of the wafer 11 by means of a front-to-back aligner or by etching alignment holes through the wafer and aligning to the alignment holes. The sidewalls 17 which define the interior corners of the slots 18 are to be defined by the (111) planes of the crystalline material and are aligned parallel to the (110) planes. The metal layers are etched through the developed openings in the photoresist layer by suitable etchants. For example, gold is etched using a potassium iodide base etchant, the TiW is etched by an aqueous solution of hydrogen peroxide and the zirconium is etched by a 100 to 1 dilute aqueous solution of hydrofluoric acid. This opens the metallization in the pattern as shown in FIG. 3 to the N epi layers 12 and 13. These epitaxial layers 12 and 13 will constitute the etch stopped layers when the substrate P material 11 is being etched. However, the etch stopped layers 12 and 13 are opened to expose the substrate P material by etching the wafer in a suitable silicon etch such as a 1.5 normal aqueous solution of lithium hydroxide at a temperature of approximately 85° C. The etch rate for Si in lithium hydroxide is approximately three microns per minute at the aforecited temperature and normality.

Next, an etch stop potential is applied to the etch stopped layers 12 and 13 to passivate these layers, while allowing etching of the substrate material. A suitable electro-etch stop etching apparatus is as shown in FIG. 4. More particularly, the gold layers on opposite sides of the wafer 11 are clasped between spring biased tongs 21. The tongs should be made of an etch resistant material, for example, zirconium wire. The ends of the zirconium wire which are to make contact with the wafer 11 preferably contact the wafer through the intermediary of a pair of platinum tabs 22 to provide a relatively large area contact. The wafer 11 is located between a pair of platinum electrodes 23 which hang inside the etch container 24, as of quartz, by short lengths of platinum wire 25 bent over the edge of the container 24. The platinum wires 25 are connected to ground potential.

A standard electrochemical cell 26 provides an output reference potential as of +1.1 volts relative to the potential of the electrolyte in the etch tank 24. The electrolyte of the standard cell 26 is, for example, a one normal aqueous solution of potassium hydroxide and it makes electrical contact to the electrolyte in the etch tank 24 via a side tube 27 connected in fluid communication with the etch tank 24 by tubulation 28. A flexible side tube 29 of the standard cell 26 terminates in a capillary 31 immersed in the electrolyte within the side tube 27.

In a typical example, the standard cell 26 comprises a test tube 32 having a few cm$^{-3}$ of liquid mercury 33 located in the bottom of the test tube. Next, a relatively thin layer of mercury oxide 34 is placed over the mercury layer 33. Next, glass wool 35 is loosely packed into the test tube for holding the mercury oxide powder in position over the mercury and also for holding an insulated copper lead 36 in vertical position within the central region of the test tube 32. One bare end of the insulated lead 36 is immersed within the mercury layer 33. The other end of the insulated lead 36 provides the output terminal 37 of the standard cell 26. The insulated lead 36 passes through a rubber stopper 38 which stops the upper end of the test tube 32. The test tube is filled with a suitable electrolyte such as a one normal aqueous solution of potassium hydroxide. Thus, the potential on output terminal 37 of the standard cell is always a known reference potential such as +1.1 volts relative to the potential of the electrolyte in the etch tank 24.

In the electro-etch stop process, a passivating potential of approximately +0.5 volts is applied to the layer of silicon to be etch stopped relative to the potential of the etchant (electrolyte) such as a 1.5 normal aqueous solution of LiOH at 85° C. This is achieved in the circuit of FIG. 4 by means of a reference battery 39 poled in opposition to the standard cell output voltage at terminal 37. A potentiometer 41 is connected across battery 39 and the output of the potentiometer 41 is fed to the positive input terminal of an operational amplifier 42 having its output connected back to its minus input reference terminal. The battery 39, potentiometer 41 and operational amplifier 42 produce an output voltage $V_s$ of negative polarity relative to the polarity of the reference potential at the output of the standard cell 26. The voltage difference is the output voltage $V_o$ applied between the gold electrodes on the wafer 11 and the electrolyte in tank 24. $V_o$ is selected to be approximately +0.5 volts for passivation of the etch stop layers 12 and 13.

The operational amplifier 42 sources sufficient current, such as 0.5 amps, at constant voltage as selected by the potentiometer 41. The current passes from the operational amplifier 42 through an ammeter 43 and thence through the clip 21 to the gold electrodes 16 on the wafer 11. The current then is drawn through the non-etch stopped portion of the wafer, such as the P layer, to ground via the platinum ground electrodes 23. No current is drawn by the standard cell 26 nor by the voltage selecting portion of the operational amplifier 42. Operational amplifier 42 does have a ground common to the platinum electrodes 23 for current sinking the current drawn through the etch tank.

Referring now to FIGS. 3, 5 and 6, the anisotropic etch through the wafer to define the folded cantilever structures is as follows: after the epitaxial layers 12 and 13 have been slotted in accordance with the slot pattern 18 of FIGS. 3 to expose the underlying P type conductivity semiconductive material, the etch stop potentials are applied and the circuit completed as shown in FIG. 4. Thereafter, the anisotropic etch proceeds through the slots 18 clear through the wafer 11 from both sides. The slots 18 intersect midway of the thickness of the wafer 11. After the slots intersect, the etchant begins to substantially undercut the etch stopped layers 12 and 13 to define folded cantilever beam portions 51.

The undercut etch starts at the exterior corners 52 of the folded cantilever beam portions 51 and etch facets form indicated by the hatching lines 53. These facets 53 are etched (recede) in the direction of the arrows. When the etch facets 53 intersect with the (111) planes, at the walls at opposite ends of the cantilever beam portions 51, they terminate on the (111) planes and form a continuation of the (111) walls, indicated by dotted lines 50, which intersect with the (111) planes of the slots 18, thereby forming exterior corners 56.

The undercutting is terminated when the undercutting has advanced to the state where the folded cantilever beam portions 51 are completely undercut leaving boss portions 54 of the frame structure at one end and a mass structure 55 at the other end of the undercut folded cantilever beam portions 51. The frame 54 is separated from the mass by means of slots 18. Thus, at the termination of the undercutting etch, the double folded cantilever spring structure is formed wherein each of the folded cantilever beam portions 51 is fixedly secured at one end to the frame 54 via the boss portion 54 and at the other end is fixedly secured to the central mass structure 55. The mass is free to move relative to the frame by flexure of the folded cantilever spring portions 51. The result is a composite spring structure suitable for an accelerometer which is symmetrical to reduce cross-axis sensitivity and which is of single crystalline material completely free of bonding layers and the like.

After the etching has been completed, the metallization layers are stripped from the wafer 11 and the array of folded cantilever spring structures may then be bonded, as by electro-static bonding, to glass plates on opposite sides of the wafer. These glass plates have arrays of electrodes for capacitively sensing deflection of the silicon flexes in response to inertia or gravitational forces to form completed accelerometer units. The bonded silicon and glass plates may then be separated into individual accelerometer devices by dicing with a dicing saw in a conventional manner.

As an alternative to N epi etch stop layers 12 and 13 on P type substrate material 11, the epi layers 12 and 13 may be of P material on an N type substrate 11. The electro-etch stop is then applied in a similar manner as disclosed by U.S. Pat. No. 3,689,389 issued Sept. 5, 1972.

As another alternative, the etch stop layers 12 and 13 may be formed by a high concentration boron diffusion to form P+ etch stop layers, i.e. boron impurity concentration $>5 \times 10^{19} cm^{-3}$. In the case of high concentration boron P+ etch stopped layers 12 and 13, a particularly suitable anisotropic etchant is ethylene diamine, pyrocatechol and water as described in an article entitled: "A Water-Amine Complexing Agent System for Etching Silicon" appearing in the Journal of Electro-Chemical Society, Vol. 114, pg. 965 (1967). As another alternative, the etch stop layer 12 and 13 are silicon dioxide and the etchant for the silicon is ethylene diamine, pyrocatechol and water.

The advantages afforded by etching three dimensional structures, in accordance with the present invention, include less processing with attendant higher yields of completed devices. In addition, foreign bonding materials are eliminated together with the bonding steps and resultant temperature coefficients and thickness variations. Folded cantilever spring structures fabricated in the above manner are useful as accelerometer flexes, gauging transducers, valves and many other devices.

What is claimed is:

1. In a method for making three-dimensional structures by chemical etching of a semiconductive wafer, the steps of:
    providing a pair of etch stopped layers on opposite major faces of a semiconductive wafer of semiconductive material;
    introducing an etchant through openings in both of said etch stopped layers;
    etching the substrate semiconductor through said openings in both etch stopped layers to undercut substantial portions of both of said etch stopped layers;
    terminating the etch of substrate material so as to leave undercut structure in both of said etch stopped layers interconnected by interconnecting substrate semiconductive material whereby a three-dimensional structure is made; and
    patterning the openings of said etch stopped layers to define a frame structure and cantilever beam portions of said etch stopped layers on both sides of said wafer, said cantilever beam portions being undercut by said etchant when the etch is terminated, one end of the undercut cantilever beam portions being supported from the frame structure and the other ends being supported from said interconnecting substrate material which is free to move relative to said frame structure by bending of the undercut cantilever beam portions.

2. The method of claim 1 wherein said substrate material and said etch stopped layers are of single crystalline semiconductive material.

3. The method of claim 2 wherein said etch stopped layers of single crystalline material are of opposite conductivity type to that of said substrate semiconductive material, whereby rectifying junctions are formed at the interface of said etch stopped layers with said substrate semiconductive material.

4. The method of claim 2 wherein said etch stopped layers of single crystalline material are doped with an impurity current carrier dopant to a sufficient concentration so as to cause said layers to exhibit the etch stopped characteristic to the etchant introduced through the openings in said etch stopped layers.

5. The method of claim 2 wherein the step of etching the substrate material includes etching said substrate material completely through the thickness of the substrate portion of the wafer.

6. The method of claim 3 including the step of applying an etch stop potential to said layers relative to the potential of said substrate material to cause said layers to exhibit the etch stop characteristic for the etchant introduced through the openings in said layers.

7. The method of claim 2 wherein said major faces of said wafer constitute the (100) crystal faces of the single crystalline diamond cubic type substrate semiconductive material.

8. The product made by method of claim 1.

9. The product made by the method of claim 2.

10. The method of claim 1 wherein the openings in both of said etch stopped layers are patterned so that the cantilever beam portions are folded back onto themselves in the plane of the respective etch stopped layers, and the free ends of said folded cantilever beam portions on opposite sides of said wafer are interconnected by substrate material free to move relative to said frame structure by bending of said cantilever beam portions.

* * * * *